United States Patent
Kaimori et al.

(10) Patent No.: US 12,213,249 B2
(45) Date of Patent: Jan. 28, 2025

(54) METHOD FOR MANUFACTURING DIELECTRIC SHEET, METHOD FOR MANUFACTURING SUBSTRATE FOR HIGH-FREQUENCY PRINTED WIRING BOARD, DIELECTRIC SHEET, AND SUBSTRATE FOR HIGH-FREQUENCY PRINTED WIRING BOARD

(71) Applicants: SUMITOMO ELECTRIC INDUSTRIES, LTD., Osaka (JP); SUMITOMO ELECTRIC PRINTED CIRCUITS, INC., Shiga (JP)

(72) Inventors: Shingo Kaimori, Osaka (JP); Takashi Ninomiya, Osaka (JP); Motohiko Sugiura, Osaka (JP); Yasuhiro Okuda, Osaka (JP); Hideki Kashihara, Shiga (JP); Satoshi Kiya, Shiga (JP); Makoto Nakabayashi, Osaka (JP); Kentaro Okamoto, Osaka (JP); Chiaki Tokuda, Osaka (JP)

(73) Assignees: SUMITOMO ELECTRIC INDUSTRIES, LTD., Osaka (JP); SUMITOMO ELECTRIC PRINTED CIRCUITS, INC., Shiga (JP)

( * ) Notice: Subject to any disclaimer, the term of this patent is extended or adjusted under 35 U.S.C. 154(b) by 352 days.

(21) Appl. No.: 17/632,016

(22) PCT Filed: May 11, 2021

(86) PCT No.: PCT/JP2021/017917
§ 371 (c)(1),
(2) Date: Feb. 1, 2022

(87) PCT Pub. No.: WO2021/235276
PCT Pub. Date: Nov. 25, 2021

(65) Prior Publication Data
US 2022/0272838 A1    Aug. 25, 2022

(30) Foreign Application Priority Data
May 18, 2020   (JP) .................... 2020-087052

(51) Int. Cl.
*H05K 1/03* (2006.01)
*B29C 48/00* (2019.01)
(Continued)

(52) U.S. Cl.
CPC ........ *H05K 1/0373* (2013.01); *B29C 48/0011* (2019.02); *B29C 48/0021* (2019.02);
(Continued)

(58) Field of Classification Search
CPC .......................... H05K 1/0353; H05K 1/0373
See application file for complete search history.

(56) References Cited

U.S. PATENT DOCUMENTS

| 4,335,180 A | 6/1982 | Traut |
| 4,849,284 A | 7/1989 | Arthur et al. |

(Continued)

FOREIGN PATENT DOCUMENTS

| JP | 2003-025423 | 1/2003 |
| JP | 2008-235346 | 10/2008 |

(Continued)

OTHER PUBLICATIONS

"Processing of Dyneon PTFE Fine Powder". 3M, (2015); pp. 1-28.*

*Primary Examiner* — Prashant J Khatri
(74) *Attorney, Agent, or Firm* — IPUSA, PLLC

(57) ABSTRACT

A method for manufacturing a dielectric sheet, includes the steps of extrusion molding a mixture including powder polytetrafluoroethylene and spherical silica at a temperature lower than or equal to a melting point of the polytetrafluoroethylene, and calendering a sheet body obtained by the extrusion molding. A mass ratio of the silica with respect to
(Continued)

the polytetrafluoroethylene is 1.3 or greater. An average particle diameter of the silica is 0.1 μm or greater but 3.0 μm or less. A reduction ratio of the extrusion molding is 8 or less.

9 Claims, 2 Drawing Sheets

(51) Int. Cl.
| | |
|---|---|
| *B29C 48/08* | (2019.01) |
| *B32B 15/082* | (2006.01) |
| *B32B 15/20* | (2006.01) |
| *H05K 1/02* | (2006.01) |
| *H05K 3/00* | (2006.01) |
| *H05K 3/02* | (2006.01) |
| *H05K 3/38* | (2006.01) |
| *B29K 27/18* | (2006.01) |
| *B29K 509/00* | (2006.01) |
| *B29L 31/34* | (2006.01) |

(52) U.S. Cl.
CPC ............ *B29C 48/08* (2019.02); *B32B 15/082* (2013.01); *B32B 15/20* (2013.01); *H05K 1/024* (2013.01); *H05K 3/0014* (2013.01); *H05K 3/022* (2013.01); *B29K 2027/18* (2013.01); *B29K 2509/00* (2013.01); *B29K 2995/0006* (2013.01); *B29L 2031/3425* (2013.01); *B32B 2307/204* (2013.01); *B32B 2457/08* (2013.01); *H05K 3/386* (2013.01); *H05K 2201/015* (2013.01); *H05K 2201/0209* (2013.01); *H05K 2201/0266* (2013.01)

(56) References Cited

U.S. PATENT DOCUMENTS

| | | | |
|---|---|---|---|
| 5,149,590 A | 9/1992 | Arthur et al. | |
| 5,312,576 A | 5/1994 | Swei et al. | |
| 5,506,049 A | 4/1996 | Swei et al. | |
| 5,552,210 A | 9/1996 | Horn, III et al. | |
| 2003/0015821 A1 | 1/2003 | Huang et al. | |
| 2013/0084447 A1 | 4/2013 | Shimatani | |
| 2014/0308478 A1* | 10/2014 | Park | H05K 1/0353 428/323 |
| 2015/0307685 A1 | 10/2015 | Pham | |
| 2019/0215957 A1 | 7/2019 | Kaimori et al. | |
| 2020/0079931 A1* | 3/2020 | Yakuwa | C08K 9/06 |

FOREIGN PATENT DOCUMENTS

| | | | |
|---|---|---|---|
| JP | 4260713 | 4/2009 | |
| JP | 4566058 | 10/2010 | |
| JP | 2012-001591 | 1/2012 | |
| JP | 2015-209480 | 11/2015 | |
| WO | WO-2018221556 A1 * | 12/2018 | ............ C08K 3/36 |
| WO | 2019/031071 | 2/2019 | |

* cited by examiner

METHOD FOR MANUFACTURING DIELECTRIC SHEET, METHOD FOR MANUFACTURING SUBSTRATE FOR HIGH-FREQUENCY PRINTED WIRING BOARD, DIELECTRIC SHEET, AND SUBSTRATE FOR HIGH-FREQUENCY PRINTED WIRING BOARD

TECHNICAL FIELD

The present disclosure relates to methods for manufacturing dielectric sheets, methods for manufacturing substrates for high-frequency printed wiring boards, dielectric sheets, and substrates for high-frequency printed wiring boards.

This application is based upon and claims priority to Japanese Patent Application No. 2020-087052 filed on May 18, 2020, the entire contents of which are incorporated herein by reference.

BACKGROUND ART

In recent years, due to the reduction of size and weight of electronic devices, there are increased demands to also reduce the size of printed wiring boards used in such electronic devices. From such a viewpoint, polyimide films, which exhibit excellent insulation, flexibility, heat resistance, or the like, and can promote reduction of thin film thickness, are nowadays used for base films of printed wiring boards (refer to Patent Document 1).

On the other hand, the amount of communications traffic is constantly increasing nowadays, and in order to cope with such an increase, communications in the high-frequency range, such as microwaves and millimeter waves, are becoming more popular in devices such as IC cards, portable communication terminals, or the like. For this reason, there are demands for high-frequency printed wiring boards having a low transmission loss when used in the high-frequency range.

PRIOR ART DOCUMENTS

Patent Documents

Patent Document 1: Japanese Laid-Open Patent Publication No. 2008-235346

DISCLOSURE OF THE INVENTION

A method for manufacturing a dielectric sheet according to the present disclosure includes the steps of extrusion molding a mixture including powder polytetrafluoroethylene and spherical silica at a temperature lower than or equal to a melting point of the polytetrafluoroethylene; and calendering a sheet body obtained by the extrusion molding, wherein a mass ratio of the silica with respect to the polytetrafluoroethylene is 1.3 or greater, an average particle diameter of the silica is 0.1 μm or greater but 3.0 μm or less, and a reduction ratio of the extrusion molding is 8 or less.

Another method for manufacturing a dielectric sheet according to the present disclosure includes the steps of extrusion molding a mixture including powder polytetrafluoroethylene and spherical silica at a temperature lower than or equal to a melting point of the polytetrafluoroethylene; and calendering a sheet body obtained by the extrusion molding, wherein a mass ratio of the silica with respect to the polytetrafluoroethylene is 1.3 or greater, the silica includes a first silica having an average particle diameter of 0.1 μm or greater but 0.9 μm or less, and a second silica having an average particle diameter of 4.0 μm or greater but 9.0 μm or less, a mass ratio of the first silica with respect to the polytetrafluoroethylene is 0.2 or greater but 1.9 or less, and a reduction ratio of the extrusion molding is 8 or less.

A dielectric sheet according to the present disclosure includes silica, and polytetrafluoroethylene, wherein a mass ratio of the silica with respect to the polytetrafluoroethylene is 1.3 or greater, and a ratio of a maximum tensile elongation with respect to a minimum tensile elongation is 1.5 or less, and the minimum tensile elongation is 40% or greater.

MODE OF CARRYING OUT THE INVENTION

Figure 1:
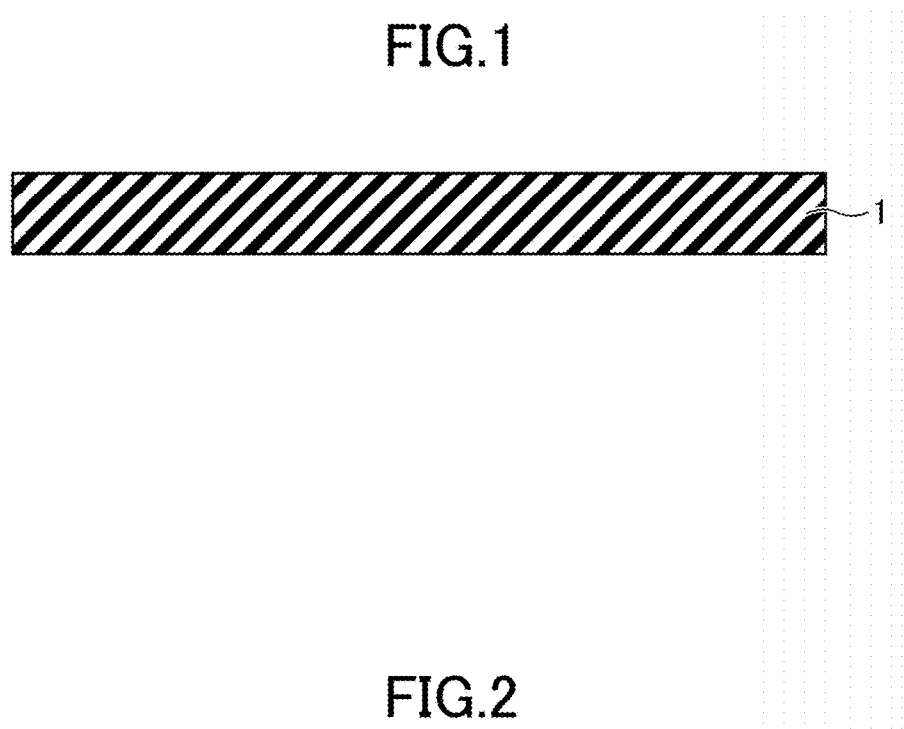
FIG. 1 is a schematic cross sectional view of a dielectric sheet according to one embodiment of the present disclosure.

Problem to be Solved by Present Disclosure

A base film including fluororesin as a main component is known as an insulating base for printed wiring boards. Because the fluororesin has a small dielectric constant, the base film including the fluororesin as the main component is suited for the insulating base for the printed wiring boards for high-frequency signal processing. Such an elemental fluororesin film is extruded into a tape shape by extrusion molding, and formed into a thin film sheet by calendering, thereby enabling a film having a small variation in thickness and a small variation in material composition to be easily obtained.

In order to ensure excellent high frequency characteristics of the printed wiring board described above, the insulating base of the printed wiring board is required to have a small variation in size with respect to a temperature change, and to have small variations in the thickness and the composition. However, the size stability of the fluororesin with respect to the temperature change is not sufficient. On the other hand, the size stability of the base film with respect to the temperature change can be improved by mixing a filler in the base film. But when a large amount of filler is mixed to the base film including the fluororesin as the main component, it becomes difficult to perform the extrusion and the calendering using general-purpose apparatuses and manufacturing conditions, because of the extremely high molding pressure or the like that is required. For this reason, manufacturing methods, other than the manufacturing method using the extrusion and the calendering, is generally employed when the manufacturing the base film. An example of the manufacturing method compacts a mixture of polytetrafluoroethylene and inorganic filler, for example, under a high pressure and at a high temperature above a melting point of the polytetrafluoroethylene, and thereafter cuts the compact into a sheet shape. According to this manufacturing method, the thickness variation becomes large, and apparatuses having an extremely large scale are required. In addition, another manufacturing method forms a low-viscosity slurry by dispersing the mixture of the polytetrafluoroethylene and the inorganic filler in a liquid, coats the slurry on a carrier film, and dries and solidifies the slurry. This other manufacturing method has a problem in that a distribution of the inorganic filler at the surface contacting the carrier film, and a distribution of the inorganic filler at the surface not contacting the carrier film, become different due to precipitation of the inorganic filler. Hence, when compared to "the manufacturing method which calenders a sheet body formed by extrusion molding", these manufacturing methods may be inferior from a viewpoint of the cost, the thickness variation, the dispersibility of the filler, or the like.

The present disclosure was conceived in view of the above described circumstances, and one object is to provide a method for manufacturing a dielectric sheet having excellent high frequency characteristics, using extrusion molding and calendering.

Effects of Present Disclosure

The method for manufacturing the dielectric sheet according to the present disclosure can easily and positively manufacture a dielectric sheet having excellent high frequency characteristics.

DESCRIPTION OF EMBODIMENTS OF PRESENT DISCLOSURE

First, embodiments of the present disclosure will be described in the following.

A method for manufacturing a dielectric sheet according to one aspect of the present disclosure includes the steps of extrusion molding a mixture including powder polytetrafluoroethylene and spherical silica at a temperature lower than or equal to a melting point of the polytetrafluoroethylene, and calendering a sheet body obtained by the extrusion molding, wherein a mass ratio of the silica with respect to the polytetrafluoroethylene is 1.3 or greater, an average particle diameter of the silica is 0.1 μm or greater but 3.0 μm or less, and a reduction ratio of the extrusion molding is 8 or less.

The method for manufacturing the dielectric sheet can positively manufacture a dielectric sheet having excellent high frequency characteristics. The reasons for this may be regarded as follows. As described above, the fluororesins, such as the polytetrafluoroethylene, have a small dielectric constant and a low dielectric loss factor, and thus, although the high-frequency printed wiring board manufactured from the substrate using fluororesin have excellent high frequency characteristics, the linear expansion coefficient is large and the size stability is insufficient, with respect to the temperature change. Because the wavelength becomes shorter as the frequency becomes higher, the variation in size of the circuit greatly affects the electrical characteristics of the circuit. Accordingly, the large linear expansion coefficient may deteriorate the high frequency characteristics of the circuit. In the disclosed method for manufacturing the dielectric sheet, the mass ratio of silica with respect to polytetrafluoroethylene is 1.3 or greater, thereby decreasing the linear expansion coefficient of the dielectric sheet, and improving the size stability of the base film with respect to the temperature change.

When a large amount of filler is mixed to the resin composition, an extremely high extrusion molding pressure becomes required. In addition, the mixing of the filler decreases the cohesion. When the cohesion of the mixture decreases, the mixture at an end portion of the flow passage of the extrusion molding is easily affected by a frictional force at an inner wall of an extrusion molding machine, and it is more difficult to apply the extrusion pressure to the mixture at the end portion than at a center portion of the flow passage. As a result, a phenomenon in which cracks are generated in the mixture between the end portion and the center portion of the flow passage, thereby extruding the mixture only from the center portion, and a phenomenon in which no cracks are generated but wrinkles are generated in the mixture at the center portion because an extrusion rate at the center portion is higher than at the end portion, are likely to occur. Moreover, in the extrusion molding using the polytetrafluoroethylene causes fibrillization, that is, elongation and alignment of molecular chains in a longitudinal direction, thereby increasing the extrusion molding pressure, and easily generating cracks in the mixture due to the low cohesion between the aligned fibers. Accordingly, it is extremely difficult to stably and uniformly perform the extrusion molding. The disclosed method for manufacturing the dielectric sheet employs the extrusion molding and the calendering having excellent production efficiency, and makes the reduction ratio (RR) of the extrusion molding 8 or less, so as to reduce an excessive increase in the strength along the longitudinal direction caused by the molecular chains of the polytetrafluoroethylene aligned in the longitudinal direction. Hence, the frictional force between the inner wall of the extrusion molding machine and the mixture described above can be reduced, and enable the extrusion molding to be performed at a low pressure.

In addition, in the extrusion molding of the resin composition, it is generally known that the smaller the particle diameter of the filler to be mixed becomes, the larger the contact area between the filler and the resin composition becomes and the higher the molding viscosity becomes, thereby requiring a higher extrusion molding pressure, and making the extrusion molding more difficult. On the other hand, the present inventors found that when the filler is mixed to the polytetrafluoroethylene, the extrusion molding can be performed at a lower pressure when the particle diameter of the silica described above is smaller. It may be regarded that the silica covers the surface of the polytetrafluoroethylene particles, to prevent fibrillization attributable to contact between the polytetrafluoroethylene particles, and consequently enables the extrusion at the low pressure. In the disclosed method for manufacturing the dielectric sheet, the extrusion molding at the low pressure becomes possible by making the average particle diameter of the silica to 0.1 μm or greater but 3.0 μm or less, and the uniformity of the filler and the uniformity of the thin film thickness can be ensured without generating the cracks or wrinkles, thereby enabling the dielectric sheet having the excellent high frequency characteristics to be easily and positively manufactured.

A method for manufacturing a dielectric sheet according to another aspect of the present disclosure includes the steps of extrusion molding a mixture including powder polytetrafluoroethylene and spherical silica at a temperature lower than or equal to a melting point of the polytetrafluoroethylene, and calendering a sheet body obtained by the extrusion molding, wherein a mass ratio of the silica with respect to the polytetrafluoroethylene is 1.3 or greater, the silica includes a first silica having an average particle diameter of 0.1 μm or greater but 0.9 μm or less, and a second silica having an average particle diameter of 4.0 μm or greater but 9.0 μm or less, a mass ratio of the first silica with respect to the polytetrafluoroethylene is 0.2 or greater but 1.9 or less, and a reduction ratio of the extrusion molding is 8 or less.

The disclosed method for manufacturing the dielectric sheet can positively manufacture a dielectric sheet having excellent high frequency characteristics. The reasons for this may be regarded as follows. As described above, the fluororesins, such as the polytetrafluoroethylene, have a small dielectric constant and a low dielectric loss factor, and thus, although the high-frequency printed wiring board manufactured from the substrate using fluororesin have excellent high frequency characteristics, the linear expansion coefficient is large and the size stability is insufficient, with respect to the temperature change. Because the wavelength becomes shorter as the frequency becomes higher, the variation in size of the circuit greatly affects the electrical characteristics of the circuit. Accordingly, the large linear expansion coefficient may deteriorate the high frequency characteristics of the circuit. In the disclosed method for manufacturing the dielectric sheet, the mass ratio of silica with respect to polytetrafluoroethylene is 1.3 or greater, thereby decreasing the linear expansion coefficient of the dielectric sheet, and improving the size stability of the base film with respect to the temperature change.

When a large amount of filler is mixed to the resin composition, an extremely high extrusion molding pressure becomes required. In addition, the mixing of the filler decreases the cohesion. When the cohesion of the mixture decreases, the mixture at an end portion of the flow passage of the extrusion molding is easily affected by a frictional force at an inner wall of an extrusion molding machine, and it is more difficult to apply the extrusion pressure to the mixture at the end portion than at a center portion of the flow passage. As a result, a phenomenon in which cracks are generated in the mixture between the end portion and the center portion of the flow passage, thereby extruding the mixture only from the center portion, and a phenomenon in which no cracks are generated but wrinkles are generated in the mixture at the center portion because an extrusion rate at the center portion is higher than at the end portion, are likely to occur. Moreover, in the extrusion molding using the polytetrafluoroethylene causes fibrillization, that is, elongation and alignment of molecular chains in a longitudinal direction, thereby increasing the extrusion molding pressure, and easily generating cracks in the mixture due to the low cohesion between the aligned fibers. Accordingly, it is extremely difficult to stably and uniformly perform the extrusion molding. The disclosed method for manufacturing the dielectric sheet employs the extrusion molding and the calendering having excellent production efficiency, and makes the reduction ratio (RR) of the extrusion molding 8 or less, so as to reduce an excessive increase in the strength along the longitudinal direction caused by the molecular chains of the polytetrafluoroethylene aligned in the longitudinal direction. Hence, the frictional force between the inner wall of the extrusion molding machine and the mixture described above can be reduced, and enable the extrusion molding to be performed at a low pressure.

In addition, in the extrusion molding of the resin composition, it is generally known that the smaller the particle diameter of the filler to be mixed becomes, the larger the contact area between the filler and the resin composition becomes and the higher the molding viscosity becomes, thereby requiring a higher extrusion molding pressure, and making the extrusion molding more difficult. In the disclosed method for manufacturing the dielectric sheet, the silica described above includes a combination of a first silica having an average particle diameter of 0.1 μm or greater but 0.9 μm or less, and a second silica having an average particle diameter of 4.0 μm or greater but 9.0 μm or less, and the mass ratio of the first silica with respect to the polytetrafluoroethylene falls within the above described range, thereby enabling the extrusion molding at a low pressure, ensuring the uniformity of the filler and the uniformity of the thin film thickness without generating the cracks or wrinkles, and enabling the dielectric sheet having the excellent high frequency characteristics to be easily and positively manufactured.

A draft of the calendering step is preferably 0.93 or greater. As described above, when the draft is 0.93 or greater, the fibrillization of the polytetrafluoroethylene is promoted during the calendering step, to increase the elongation, thereby enabling a dielectric sheet having an excellent bending resistance to be obtained. In addition, because it is unnecessary to promote the fibrillization of the polytetrafluoroethylene which requires a high pressure during the extrusion molding, it is possible to perform the extrusion molding at a low pressure.

A method for manufacturing a substrate for a high-frequency printed wiring board, according to another aspect of the present disclosure, includes the steps of manufacturing the dielectric sheet by the disclosed method for forming the dielectric sheet, and laminating a copper film directly or indirectly on a surface of the dielectric sheet. The step of indirectly laminating copper film on the surface of the dielectric sheet may be the step of laminating the copper film on the surface of the dielectric sheet after subjecting the dielectric sheet to a surface treatment, or the step of laminating the copper film on the surface of the dielectric sheet via other layers. In the disclosed method for manufacturing the substrate for the high-frequency printed wiring board, the mass ratio of silica with respect to polytetrafluoroethylene is 1.3 or greater, thereby decreasing the linear expansion coefficient of the dielectric sheet, and improving the size stability of the base film with respect to the temperature change. In addition, by making the reduction ratio of the extrusion molding 8 or less, the frictional force between the inner wall of the extrusion molding machine and the mixture described above can be reduced, and enable the extrusion molding to be performed at a low pressure. Because the disclosed method for manufacturing the substrate for the high-frequency printed wiring board includes the step of directly or indirectly laminating the copper film on the surface of the dielectric sheet having the excellent high frequency characteristics, it is possible to easily and positively manufacture the substrate for the high-frequency printed wiring board having the excellent high frequency characteristics.

In the disclosed method for manufacturing the substrate for the high-frequency printed wiring board, the step of laminating the copper film preferably laminates the copper film on the surface of the dielectric sheet via an adhesive layer, and the adhesive layer preferably includes a thermoplastic fluororesin as a main component. When the step of laminating the copper film laminates the copper film on the surface of the dielectric sheet via the adhesive layer, and the adhesive layer includes the thermoplastic fluororesin as the main component, it is possible to strongly bond the low-roughness copper film and the dielectric sheet, while ensuring the excellent high frequency characteristics attributable to the fluororesin.

A dielectric sheet according to another aspect of the present disclosure includes silica, and polytetrafluoroethylene, wherein a mass ratio of the silica with respect to the polytetrafluoroethylene is 1.3 or greater, and a ratio of a maximum tensile elongation with respect to a minimum tensile elongation is 1.5 or less, and the minimum tensile elongation is 40% or greater.

The disclosed dielectric sheet has excellent frequency characteristics, by including the polytetrafluoroethylene. In addition, when the mass ratio of the silica with respect to the polytetrafluoroethylene is 1.3 or greater, it is possible to reduce the linear expansion coefficient of the dielectric sheet, thereby improving the size stability of the disclosed dielectric sheet with respect to the temperature change. Accordingly, the disclosed dielectric sheet has excellent high frequency characteristics. Further, when the mass ratio of the silica is high, the properties of the dielectric sheet become similar to ceramic properties, and usually, the elongation is small and the bending resistance is poor. However, in the disclosed dielectric sheet, the maximum tensile elongation (hereinafter also referred to as an "elongation anisotropy coefficient") with respect to the minimum tensile elongation is 1.5 or less, and the minimum tensile elongation is 40% or greater, thereby exhibiting an excellent bending resistance even though the mass ratio of the silica is high.

In a longitudinal cross section in a thickness direction, the dielectric sheet preferably has a layered first phase including the polytetrafluoroethylene as a main component, and a layered second phase including the silica as a main component. Because the dielectric sheet includes the first phase and the second phase, it becomes easier to bring out each of the properties of the polytetrafluoroethylene, namely, the large elongation and large strength due to fibrillization, and the properties of the silica, namely, the reduced linear expansion coefficient.

In the disclosed dielectric sheet, the thickness of the first phase is preferably 0.1 μm or greater but 10.0 μm or less. If the layered first phase has a thickness less than the lower limit described above, the extent of fibrillization of the polytetrafluoroethylene may decrease, and it may be difficult to obtain the large elongation. On the other hand, if the thickness of the layered first phase exceeds the upper limit described above, it may be difficult to reduce the linear expansion coefficient to fall within a desired range.

The silica described above preferably includes an alkyl group having a carbon number of 4 or greater on a surface of the silica. By including the alkyl group having the carbon number of 4 or greater on the surface of the silica, the adhesion between the silica and the polytetrafluoroethylene increases to improve the elongation, and the disclosed dielectric sheet can have an excellent fold resistance.

A substrate for a high-frequency printed wiring board according to another aspect of the present disclosure includes the disclosed dielectric sheet, and a copper film laminated directly or indirectly on a surface of the dielectric sheet.

Because the substrate for the high-frequency printed wiring board includes the disclosed dielectric sheet, and the copper film laminated directly or indirectly on the surface of the dielectric sheet, the substrate for the high-frequency printed wiring board has excellent high frequency characteristics and bending resistance.

A maximum height roughness Rz of the copper film at a surface of the copper film on the side of the dielectric sheet is preferably less than or equal to 2 μm. When the maximum height roughness Rz of the copper film at the surface of the copper film on the side of the dielectric sheet falls within the above described range, irregularities in a portion where the high-frequency signal concentrates due to the skin effect become small, and a current more easily flows linearly, thereby enabling the transmission loss to be further reduced. Accordingly, it is possible to further improve the high frequency characteristics of the substrate for the high-frequency printed wiring board.

The copper film described above is preferably laminated on the surface of the dielectric sheet via an adhesive layer including a fluororesin as a main component. When the copper film is laminated on the surface of the dielectric sheet via the adhesive layer including the fluororesin as the main component, it is possible to strongly bond the low-roughness copper film and the dielectric sheet, while ensuring the excellent high frequency characteristics attributable to the fluororesin.

In the present disclosure, an "average particle diameter" of the silica refers to a primary particle diameter represented by a center diameter D50 of a volume particle size distribution. The average particle diameter can be measured by a particle diameter distribution measuring device (for example, "MT3300II" manufactured by MicrotracBEL Corp.). A "reduction ratio" refers to a value which is obtained by dividing a maximum cross sectional area by a minimum cross sectional area, in a cross sectional area of a flow passage through which a material to be subjected to the extrusion molding passes during an extrusion molding step. A "maximum height roughness Rz" refers to a maximum height roughness measured in conformance with JIS-B-0601 (1982). A "main component" refers to a component having a largest content, such as a component having a content of 50 mass % or greater. A "draft" refers to a rate of change of the sheet thickness represented by (h0−h1)/h0, when the sheet thickness before the calendering step is denoted by h0, and the sheet thickness after the calendering step (after the last stage when the pressing is performed in two or more stages) is denoted by h1. The higher the value of the draft, the greater the rate of change of the sheet thickness caused by the calendering step. A "maximum tensile elongation" refers to a maximum elongation of the tensile elongation of the dielectric sheet in any in-plane direction, measured by a test method in conformance with IPC-TM-650 2.4.19, and a "minimum tensile elongation" refers to a minimum elongation of the tensile elongation of the dielectric sheet measured in a similar manner.

Details of Embodiments of Present Disclosure

Hereinafter, the method for manufacturing the dielectric sheet, the method for manufacturing the substrate for the high-frequency printed wiring board, the dielectric sheet, and the substrate for the high-frequency printed wiring board according to embodiments of the present disclosure will be described in detail.

<Method for Manufacturing Dielectric Sheet>

The disclosed method for manufacturing the dielectric sheet includes the steps of preparing powder polytetrafluoroethylene and spherical silica, extrusion molding a mixture including the powder polytetrafluoroethylene and the spherical silica at a temperature lower than or equal to a melting point of the polytetrafluoroethylene, and calendering a sheet body obtained by the extrusion molding. By employing the steps of extrusion molding and calendering, the disclosed method for manufacturing the dielectric sheet can efficiently manufacture the dielectric sheet including the polytetrafluoroethylene. In addition, the disclosed method for manufacturing the dielectric sheet preferably further includes the steps of mixing the material, and removing an assistant.

[Material Mixing Step]

In this step, the powder polytetrafluoroethylene and the spherical silica are prepared, and a mixture including the powder polytetrafluoroethylene and the spherical silica is made. An assistant (liquid lubricant) is preferably added to the mixture described above. Hereinafter, the powder polytetrafluoroethylene may also be referred to as "polytetrafluoroethylene powder", and the spherical silica may also be simply referred to as "silica".

The mixing method is not particularly limited, as long as the method can mix the material. Examples of the mixing method include a dry type method, namely, a method which mixes the polytetrafluoroethylene powder, the silica powder, and the assistant, and a wet type method, namely, a method which mixes a polytetrafluoroethylene dispersion and a liquid including a silica dispersion, coagulating and collecting the mixture, and mixing the assistant to the mixture. The dry type method is preferable because it is easy to obtain a state where the first phase and the second phase described above become layered. In the dry type method described above, the polytetrafluoroethylene powder, the silica, and the assistant may be placed in a sealed container, and the container may be rotated at a low temperature of 10° C. or lower, for example, to mix each material.

The polytetrafluoroethylene powder is not particularly limited, as long as the polytetrafluoroethylene powder can be used for the extrusion molding, and fine powder may preferably be used. The fine powder is obtained by precipitating and drying a polytetrafluoroethylene dispersion having an average particle diameter of 0.1 μm to 0.5 μm obtained by emulsion polymerization of tetrafluoroethylene. The average particle diameter of the fine powder is 20 μm to 1000 μm, for example. Because a uniform fine dispersion state of the fine powder with the silica can be easily formed, an upper limit of the average particle diameter of the polytetrafluoroethylene powder is preferably 700 μm, more preferably 500 μm, and even more preferably 400 μm. From a viewpoint of moderately promoting the fibrillization of the polytetrafluoroethylene, a lower limit of the average particle diameter of the polytetrafluoroethylene powder is preferably 50 μm, more preferably 100 μm, and even more preferably 200 μm.

The silica described above may be a natural product or a synthetic product, and may be crystalline or noncrystalline, and may be made by the dry type method or the wet type method. From a viewpoint of availability and quality, the silica is preferably a synthetic silica made by the dry type method. The silica is preferably spherical, due to an excellent workability of drilling or the like. According to a typical silica manufacturing method, the manufactured silica has a single peak in a particle diameter distribution thereof, and the distribution gradually decrease before and after the peak. Moreover, by eliminating the particles having a particle diameter greater than or equal to a certain size, a lower slope portion of the distribution is cut off on the side of the larger particle diameter, and as a result, many commercially available silica have an average particle diameter smaller than those without the cut off distribution. From the viewpoint of workability of drilling or the like, an upper limit of the average particle diameter of the silica described above is preferably 9.0 μm, more preferably 7.0 μm, even more preferably 5.0 μm, and particularly preferably 3.0 μm or less.

When extrusion molding the mixture of the silica and the polytetrafluoroethylene, the fibrillization of the polytetrafluoroethylene occurs, that is, the molecular chains are elongated and aligned in the longitudinal direction, compared to extrusion molding only the polytetrafluoroethylene, thereby increasing the extrusion molding pressure. In a general extrusion molding, the smaller the particle diameter of the silica becomes, the higher the viscosity of the extrusion molded material becomes, thereby requiring a high extrusion molding pressure. However, the present inventors found that, in the case of the mixture of the polytetrafluoroethylene and the silica, the smaller the particle diameter, the less the fibrillization progresses, thereby enabling the extrusion molding pressure to be reduced. In an extrusion molding step, the fibrillization occurs from a contact point of adjacent polytetrafluoroethylene particles. When the polytetrafluoroethylene and the silica having the moderately small particles are mixed in the mixing step, it may be regarded that the silica having the small particle diameter covers a surface layer of the polytetrafluoroethylene, thereby reducing the contact between the polytetrafluoroethylene particles, reducing the fibrillization, and reducing the extrusion molding pressure of the subsequent extrusion molding step.

Because the extrusion molding can be performed at a low pressure, the average particle diameter of the silica is preferably 3.0 μm or less, more preferably 2.0 μm or less, and even more preferably 1.0 μm or less. When the average particle diameter of the silica falls within the above described range, the uniformity of the filler and the uniformity of the thin film thickness can be ensured without generating the cracks or wrinkles, thereby enabling the dielectric sheet having the excellent high frequency characteristics to be easily and positively manufactured. The average particle diameter of the silica is preferably 0.1 μm or greater, more preferably 0.3 μm or greater, and even more preferably 0.5 μm or greater. Silica having an average particle diameter less than 0.1 μm can be manufactured by the sol-gel method or the like, but the silica particles will easily aggregate while the silica particles will uneasily disperse. Because the surface area becomes large even after the dispersion, and an interaction between the silica and the polytetrafluoroethylene greatly affects the physical properties, the extrusion molding pressure may increase, or the elongation of a molded body may decrease, if silica has the average particle diameter less than 0.1 μm. A plurality of kinds of silica having different average particle diameters falling within the above described range may be combined and used.

In addition, when silica having an average particle diameter greater than 3.0 μm is used, the extrusion molding at a low pressure becomes possible by combining silica having a moderately small particle diameter. More particularly, large particle sized silica having an average particle diameter of 4.0 μm or greater but 9.0 μm or less, is preferably mixed with small particle sized silica having an average particle diameter of 0.1 μm or greater but 0.9 μm or less. The average particle diameter of the large particle sized silica is preferably 5.0 μm or greater but 8.0 μm or less, and more preferably 6.0 μm or greater but 7.0 μm or less. The average particle diameter of the small particle sized silica is preferably 0.1 μm or greater but 0.7 μm or less, and more preferably 0.1 μm or greater but 0.4 μm or less. By covering the surface layer of the polytetrafluoroethylene with the small particle sized silica, it is possible to reduce the fibrillization of the polytetrafluoroethylene, and enable the extrusion molding at a low pressure. Furthermore, by mixing the small particle sized silica with the large particle sized silica, properties attributable to the polytetrafluoroethylene, such as large elongation and high cohesion, for example, can easily be developed, and the linear expansion coefficient can be reduced, when compared to the case where only the small particle sized silica is used. When mixing the small particle sized silica and the large particle sized silica, the mass ratio of the small particle sized silica with respect to the polytetrafluoroethylene is preferably 0.2 or greater but 1.9 or less, more preferably 0.2 or greater but 1.5 or less, even more preferably 0.3 or greater but 1.0 or less, and particularly preferably 0.4 or greater but 0.7 or less.

The silica described above preferably includes the alkyl group having the carbon number of 4 or greater on the surface of the silica. By including the alkyl group having the carbon number of 4 or greater on the surface of the silica, the adhesion between the silica and the polytetrafluoroethylene increases to improve the elongation, and as a result, it is possible to manufacture a dielectric sheet having an excellent fold resistance. From a viewpoint of the boding between the surface of the silica and the alkyl group, the carbon number is more preferably 5 or greater in order to facilitate the interaction between the silica and the polytetrafluoroethylene. On the other hand, an upper limit of the carbon number is preferably 10 or less. Moreover, the alkyl group is preferably a straight-chain alkyl group. Examples of the alkyl group having the carbon number of 4 or greater include a butyl group, a pentyl group, a hexyl group, a heptyl group, an octyl group, a nonyl group, and a decyl group, for example.

The silica described above preferably does not include, on the surface thereof, a functional group other than the alkyl group, such as a vinyl group, an epoxy group, a styryl group, a methacryl group, an acrylic group, an amino group, an isocyanate group, a phenyl group, an isocyanurate group, or the like. Conventionally, it has been reported that, by treating the surface of the silica to become hydrophobic, the absorption decreases to the mechanical strength consequently improves. However, the improvement of the elongation caused by the presence of the alkyl group having the carbon number of 4 or greater, is mainly due to the bonding effect between the polytetrafluoroethylene and the silica, and not due to the increase in hydrophobicity. When the disclosed dielectric sheet is stretched and a torn cross section is observed, it can be confirmed that the end of the elongated polytetrafluoroethylene fiber is strongly bonded to the silica surface, and that the fibrillization occurs from a bonding point. When silica having the vinyl group on the surface thereof and having a higher hydrophobicity, for example, is used, such a bonding effect can only be obtained to a small extent, and the effect of improving the elongation is small.

A lower limit of the mass ratio of the silica with respect to the polytetrafluoroethylene is 1.3, preferably 1.5, and more preferably 1.6. On the other hand, an upper limit of the mass ratio of the silica is preferably 2.0, and more preferably 1.9. When the mass ratio of the silica with respect to the polytetrafluoroethylene is 1.3 or greater, the linear expansion coefficient of the dielectric sheet can be reduced, thereby improving the size stability of the dielectric sheet with respect to the temperature change. On the other hand, when the mass ratio of the silica exceeds the upper limit, the dielectric sheet becomes fragile, and the handling properties and the bending resistance may deteriorate. From a viewpoint of reducing the linear expansion coefficient, it is possible to reduce the amount of silica when mixing a filler other than the silica having the small linear expansion coefficient.

The mixture may include an inorganic filler other than silica, such as aluminum oxide, magnesium oxide, calcium oxide, talc, barium sulfate, boron nitride, zinc oxide, potassium titanate, glass, titanium oxide, and mica, for example, within a range that does not adversely affect the desired properties, as appropriate. Because the inorganic filler generally has a small linear expansion coefficient, the amount of silica can be reduced depending on the amount of inorganic filler included in the mixture. Because titanium oxide has a characteristic such that the dielectric constant varies with respect to the temperature change in a manner opposite to that of the silica or the like, and can improve the temperature stability of the dielectric constant, titanium oxide is preferably included in the mixture.

The assistant described above is not particularly limited, as long as the polytetrafluoroethylene can be wetted to facilitate plastic deformation, and is easily removable by heating after the calendering step. Examples of the assistant include petroleum solvents such as solvent naphtha, white oil, or the like, hydrocarbon oils such as undecane or the like, aromatic hydrocarbons such as toluene, xylol or the like, alcohols, ketones, esters, silicone oils, fluorochlorocarbon oils, solutions in which a polymer such as polyisobutylene, polyisoprene or the like is dissolved into these solvents, mixtures of two or more solvents, water or water solution including a surface active agent, or the like. The assistant in the mixture is preferably a single component, because the single component can be mixed uniformly compared to mixtures of multiple components. The amount of the assistant is not particularly limited, as long as the polytetrafluoroethylene can be wetted, but the mass ratio of the assistant with respect to the polytetrafluoroethylene is preferably 0.1 or greater but 0.8 or less, and more preferably 0.2 or greater but 0.7 or less, and even more preferably 0.3 or greater but 0.6 or less.

[Extrusion Molding Step]

In this step, the mixture, including the polytetrafluoroethylene powder and the spherical silica, is extrusion molded at a temperature lower than or equal to the melting point of the polytetrafluoroethylene.

The extrusion molding temperature is lower than or equal to the melting point of the polytetrafluoroethylene. More particularly, an upper limit of the extrusion molding temperature is preferably 100° C. In addition, the extrusion molding temperature is preferably higher than or equal to a transition temperature of the polytetrafluoroethylene near room temperature. More particularly, a lower limit of the extrusion molding temperature is preferably 40° C. When the extrusion molding temperature falls within the above described range, it is possible to stably perform the extrusion molding.

A cross sectional shape of the mixture which is extrusion molded in this step, cut along a plane perpendicular to an extrusion direction of the extrusion molding, is preferably a flat shape, such as a rectangular shape, an oval shape, or the like. This cross sectional shape enables easy loading of the molded body to calender rollers in a subsequent calendering step, and ensures excellent uniformity of the sheet after the calendering. The cross sectional shape described above is particularly preferably a rectangular shape. When extrusion molding the mixture so that the cross sectional shape becomes a circle, that is, so that a cylindrical shape is extruded, for example, it is difficult to load the molded body to be pinched between upper and lower calender rollers in the calendering step, thereby making the calendering difficult. If the molded body is forcibly inserted between the calender rollers by applying pressure, the molded body becomes crushed and enters between the calender rollers in a non-uniform state including voids, thereby making an undesirable sheet having an inconsistent thickness after the calendering and including the voids. When considering the smallest rectangle, which includes the cross section having the flat shape and makes contact with a contour of the cross section at several points, the larger a ratio of a length of a long side with respect to a length of a short side of the rectangle, the easier it is to load the molded body between the calender rollers, and is preferable in that the sheet after the calendering has an excellent uniformity. On the other hand, the larger the ratio of the length of the long side with respect to the length of the short side of the rectangle, the more difficult it is to transfer the extrusion pressure to an end portion (end portion formed by ends of the short side and the long side), and a phenomenon in which a tear is formed in the molded body between the end portion and a center portion (a portion near an approximate center of the long side) and only the center portion is extruded, may easily occur. Accordingly, the ratio of the length of the long side with respect to the length of the short side is preferably 6 or greater but 25 or less, more preferably 8 or greater but 20 or less, and even more preferably 10 or greater but 15 or less.

Generally, a favorable reduction ratio used in the extrusion molding of the polytetrafluoroethylene is regarded as 10 or greater but 1000 or less. An upper limit of the reduction ratio in this step is 8 or less, preferably 6 or less, more preferably 5 or less, and even more preferably 4 or less. When the upper limit of the reduction ratio in extrusion molding step falls within the above described range, it is possible to reduce an excessive increase in the strength along the longitudinal direction caused by alignment of the molecular chains of the polytetrafluoroethylene in the longitudinal direction, and thus, the frictional force between the inner wall of the extrusion molding machine and the above described mixture can be reduced, and the extrusion can be performed at a low pressure without cracking or clogging at the end. In addition, the extrusion molding at the low pressure can weaken the alignment of the fibers of the polytetrafluoroethylene in a direction of the extrusion molding, thereby increasing a margin for adjusting the anisotropy of the fibrillization in the calendering step. On the other hand, a lower limit of the reduction ratio is preferably 2 or greater, and more preferably 3 or greater. When the lower limit of the reduction ratio in the extrusion molding step falls within the above described range, the compacted, molded body includes little air trapped inside, and thus, the molded body can be calendered with ease, thereby enabling a sheet having excellent uniformity of the thickness and internal composition to be obtained by the calendering.

[Calendering Step]

In this step, the sheet body obtained by the extrusion molding step is calendered.

In the calendering step, a lower limit of the draft is preferably 0.93, more preferably 0.95, and even more preferably 0.97. When the lower limit of the draft in the calendering step falls within the above described range, the fibrillization of the polytetrafluoroethylene is promoted during the calendering step, to increase the elongation, thereby enabling a dielectric sheet having an excellent bending resistance to be obtained. Because it is unnecessary to promote the fibrillization of the polytetrafluoroethylene, which requires a high pressure, during the extrusion molding, the extrusion molding can be performed at a low pressure. On the other hand, an upper limit of the draft described above is preferably 0.99, and more preferably 0.98. When the upper limit of the draft falls within the above described range, it is possible to reduce the extent of working in the calendering step, and to reduce variations in the characteristics related to the thickness and the mechanical strength caused by excessive working.

In the calendering step, the calendering is preferably controlled by controlling a GAP value between the rollers, rather than controlling the pressure. The sheet may be calendered to a final thickness from a thickness before the calendering step, by a single calendering. However, if the draft of the single calendering is too large, the thickness variation of the sheet may become large, and the sheet may tear. Accordingly, it is preferable to calender the sheet to the final thickness by multiple calenderings.

The fibrillization and alignment of the polytetrafluoroethylene in the extrusion molding step and the calendering step can result in anisotropy of the mechanical strength, particularly the elongation, of the dielectric sheet. The anisotropy of the mechanical strength may also cause anisotropy of the linear expansion coefficient. In order to reduce such anisotropy, it is preferable, when performing the calendering multiple times in the calendering step, to perform the calendering at least once in a direction different from the extrusion direction of the extrusion molding, preferably in a perpendicular direction to the extrusion direction.

In this step, a calendering temperature is preferably 30° C. or higher but 100° C. or lower. A uniform calendering can easily be performed when the calendering temperature is 30° C. or higher, which is higher than the transition temperature of the polytetrafluoroethylene near the room temperature. Further, a uniform calendering can easily be performed when the calendering temperature is 100° C. or lower, at which the extent of vaporization of the assistant is small.

[Assistant Removing Step]

In this step, the sheet body formed in the calendering step described above is dried, and the assistant (liquid lubricant) is removed. Drying is simple and preferable as a method for removing the assistant. The drying temperature and time may be determined according to the properties of the assistant, in a temperature range below the melting point of the polytetrafluoroethylene, as appropriate.

According to the disclosed method for manufacturing the dielectric sheet, the uniformity of the filler and the uniformity of the thickness as the thin film can be ensured, and the dielectric sheet having the excellent high frequency characteristics can be easily and positively manufactured.

<Method for Manufacturing Substrate for High-Frequency Printed Wiring Board>

The method for manufacturing the substrate for the high-frequency printed wiring board includes the steps of preparing powder polytetrafluoroethylene and spherical silica, extrusion molding a mixture including the powder polytetrafluoroethylene and the spherical silica at a temperature lower than or equal to a melting point of polytetrafluoroethylene, calendering a sheet body obtained by the extrusion molding, and laminating a copper film directly or indirectly on a surface of a dielectric sheet formed after the calendering. In addition, a mass ratio of the silica with respect to the polytetrafluoroethylene is 1.3 or greater, and a reduction ratio of the extrusion molding is 8 or less. In the disclosed method for manufacturing the substrate for the high-frequency printed wiring board, because the mass ratio of the silica with respect to the polytetrafluoroethylene is 1.3 or greater, it is possible to reduce the linear expansion coefficient of the dielectric sheet, and to improve the size stability of a base film with respect to a temperature change. Moreover, because the reduction ratio of the extrusion molding to 8 or less, it is possible to reduce the frictional force between the inner wall of the extrusion molding machine and the mixture described above, and to perform the extrusion molding at a low pressure. Because the disclosed method for manufacturing the substrate for the high-frequency printed wiring board includes the step of directly or indirectly laminating copper film on the surface of the dielectric sheet having excellent high frequency characteristics, it is possible to easily and positively manufacture the substrate for high-frequency printed wiring board having the excellent high frequency characteristics.

The preferred range of the average diameter of the silica is as described above.

The steps of the disclosed method for manufacturing the substrate for the high-frequency wiring board, other than the step of laminating the copper film, are the same as those of the disclosed method for manufacturing the dielectric sheet, and a description of the other steps will be omitted.

[Copper Film Laminating Step]

In this step, the copper film is laminated directly or indirectly on the surface of the dielectric sheet formed after the calendering step. Examples of the method for laminating the copper film include a method for thermocompression bonding the dielectric sheet and the copper film, for example. However, there is concern that a bonding strength between the dielectric sheet and the copper film is small when the thermocompression of the dielectric sheet and copper film is performed without treating the dielectric sheet and the copper film. For this reason, more preferable methods include a method for thermocompression bonding after subjecting the surface of the dielectric sheet or the copper film to a surface treatment such as a corona treatment, a plasma treatment, silane-coupling treatment, or the like, a method for thermocompression bonding via an adhesive composition by forming a thin film of the adhesive composition on the surface of the dielectric sheet or the copper film, or laminating a film formed of the adhesive composition between the dielectric sheet and the copper film, or the like. In other words, the copper film may be indirectly laminated on the surface of the dielectric sheet.

A lower limit of the temperature of the thermocompression bonding described above is 320° C., and more preferably 330° C. An upper limit of the temperature of the thermocompression bonding is preferably 390° C., and more preferably 380° C. If the temperature of the thermocompression bonding is below the lower limit described above, deformation of the polytetrafluoroethylene may become difficult, and an excellent mechanical strength may not be obtainable. If the temperature of the thermocompression bonding exceeds the upper limit described above, decomposition of the polytetrafluoroethylene may cause generation of a trace corrosive gas.

The pressure of the thermocompression bonding described above is not particularly limited, is set to 4 MPa or higher but 30 MPa or lower, for example.

In the disclosed method for manufacturing the substrate for the high-frequency printed wiring board, the copper film laminating step preferably laminates the copper film on the surface of the dielectric sheet via an adhesive layer, and the adhesive layer preferably includes a thermoplastic fluororesin as a main component. In the copper film laminating step, when the copper film is laminated on the surface of the dielectric sheet via the adhesive layer, and the adhesive layer includes the thermoplastic fluororesin as the main component, it is possible to strongly bond the low-roughness copper film and the dielectric sheet, while ensuring the excellent high frequency characteristics attributable to the fluororesin.

The adhesive layer may be formed by laminating the adhesive layer on the surface of the dielectric sheet, or by laminating the adhesive layer on the surface of the copper film, before the copper film laminating step.

From a viewpoint of obtaining excellent bonding, the thermoplastic fluororesin is preferably a fluororesin having a heat softening temperature of 320° C. or lower, such as perfluoroalkoxy alkane (PFA), perfluoroethylene propene copolymer (FEP), or the like, for example.

A lower limit of the thickness of the adhesive layer described above is preferably 0.1 μm, and more preferably 0.5 μm. An upper limit of the thickness of the adhesive layer described above is preferably 5.0 μm, and more preferably 2.0 μm. When the thickness of the adhesive layer falls within the above described range, the copper film and the dielectric sheet can be strongly bonded to each other, while keeping the linear expansion coefficient of the entire substrate small.

According to the disclosed method for manufacturing the substrate for high-frequency printed wiring board, it is possible to easily and positively manufacture the substrate for the high-frequency printed wiring board having the excellent high frequency characteristics.

<Dielectric Sheet>

FIG. 1 is a schematic cross sectional view of the disclosed dielectric sheet. A dielectric sheet 1 includes silica and polytetrafluoroethylene. Because polytetrafluoroethylene has a small dielectric constant, the disclosed dielectric sheet 1 is favorable for an insulating base of a substrate for a printed wiring board for high-frequency signal processing. The disclosed dielectric sheet can be manufactured by the method for manufacturing the dielectric sheet described above.

A lower limit of the mass ratio of the silica with respect to the polytetrafluoroethylene is 1.3, preferably 1.5, and more preferably 1.6. On the other hand, an upper limit of the mass ratio of the silica with respect to the polytetrafluoroethylene is preferably 2.0, and more preferably 1.9. When the mass ratio of the silica with respect to the polytetrafluoroethylene is 1.3 or greater, it is possible to reduce the linear expansion coefficient of the dielectric sheet, thereby improving the size stability of the dielectric sheet with respect to a temperature change. On the other hand, when the mass ratio of the silica with respect to the polytetrafluoroethylene exceeds the upper limit described above, the dielectric sheet becomes fragile, and the handling properties and the bending resistance may deteriorate.

The configuration of the silica is as described above, and thus, a description thereof will be omitted.

An upper limit of the elongation anisotropy coefficient described above is 1.5, and preferably 1.2. A lower limit of the elongation anisotropy coefficient described above is preferably 1.0. If the elongation anisotropy coefficient falls outside the above described range, anisotropy occurs in the fibrillization and alignment of the polytetrafluoroethylene, and the anisotropy of the mechanical strength of the dielectric sheet may cause the dielectric sheet to easily tear in a certain direction, or cause the anisotropy of not only the mechanical strength but also the linear expansion coefficient.

A lower limit of the minimum tensile elongation of the dielectric sheet is preferably 40% or greater, more preferably 80%, even more preferably 100% or greater, and particularly preferably 150% or greater. When the minimum tensile elongation of the disclosed dielectric sheet falls within the above described range, it is possible to obtain an excellent bending resistance even though the mass ratio of the silica with respect to the polytetrafluoroethylene is high. This is because, the larger the tensile elongation, the better the bending resistance becomes. Because the elongation is mainly attributable to the fibrillization of the polytetrafluoroethylene, the elongation is greatly affected by the reduction ratio and the draft of the extrusion molding in the manufacturing method described above, when compared to an elastic coefficient, rupture strength, or the like. The tensile elongation is measured using a sample obtained by pinching the dielectric sheet by a hot press, and heating at 350° C. for 40 minutes while compressing at a pressure of 4 MPa in the thickness direction. The measurement method is in conformance with IPC-TM-650 2.4.19.

As described above, the silica preferably includes an alkyl group having a carbon number of 4 or greater on the surface of the silica, and more preferably includes an alkyl group having the carbon number of 5 or greater. On the other hand, an upper limit of the carbon number is preferably 10 or less. When the silica has the alkyl group having the carbon number of 4 or greater on the surface of the silica, the adhesion between the silica and the polytetrafluoroethylene increases and the elongation improves, and the disclosed dielectric sheet can have an excellent bending resistance. In addition, the alkyl group is preferably a straight-chain alkyl group. Examples of the alkyl group having the carbon number of 4 or greater include the butyl group, the pentyl group, the hexyl group, the heptyl group, the octyl group, the nonyl group, and the decyl group, for example.

The disclosed dielectric sheet may include an inorganic filler other than silica, such as aluminum oxide, magnesium oxide, calcium oxide, talc, barium sulfate, boron nitride, zinc oxide, potassium titanate, glass, titanium oxide, and mica, for example. Because the inorganic filler generally has a small linear expansion coefficient, the amount of silica can be reduced depending on the amount of inorganic filler included in the mixture. The inorganic filler described above is preferably titanium oxide. The temperature stability of the dielectric constant of the dielectric sheet can be improved by including an appropriate amount of titanium oxide. From a viewpoint of the workability of the dielectric sheet, a particle diameter of the titanium oxide is preferably 0.1 µm or greater but 5.0 µm or less. From a viewpoint of the temperature stability of the dielectric constant of the dielectric sheet, and making the dielectric constant small, the mass ratio of the titanium oxide with respect to the silica is preferably 0.01 or greater but 0.30 or less, and more preferably 0.02 or greater but 0.10 or less.

The dielectric sheet 1 may include other fluororesins other than the polytetrafluoroethylene. In this case, an upper limit of a content of the other fluororesins in the dielectric sheet 1 is preferably 10 mass %, and more preferably 5 mass %.

In addition, the dielectric sheet 1 may include an arbitrary component, such as a flame retardant, a flame retardant assistant, a pigment, an antioxidant, a reflection imparter, a masking agent, a lubricant, a process stabilizer, a plasticizer, a blowing agent, or the like, for example. In this case, an upper limit of a content of the arbitrary component in the dielectric sheet 1 is preferably 25 mass %, and more preferably 10 mass %.

Various known flame retardants may be used for the flame retardant, and examples of the known flame retardants include halogen-based flame retardants, such as bromine-based flame retardants, and chlorine-based flame retardants, or the like, for example.

Various known flame retardant assistants may be used for the flame retardant assistant, and examples of the known frame retardant assistant include antimony trioxide or the like, for example.

Various known pigments may be used for the pigment, and examples of the known pigments include titanium oxide or the like, for example.

Various known antioxidants may be used for the antioxidant, and examples of the known antioxidants include phenol-based antioxidants or the like, for example.

Various known reflection imparters may be used for the reflection imparter, and examples of the known reflection imparters include titanium oxide or the like, for example.

In a longitudinal cross section in the thickness direction, the dielectric sheet preferably has a layered first phase including the polytetrafluoroethylene as a main component, and a layered second phase including the silica as a main component. Because the dielectric sheet includes the first phase and the second phase, it becomes easier to bring out each of the properties of the polytetrafluoroethylene, such as the large elongation and large strength due to fibrillization, and the properties of the silica.

A thickness of the first phase is preferably 0.1 µm or greater but 10.0 µm or less, more preferably 0.1 µm or greater but 5.0 µm or less, and even more preferably 0.1 µm or greater but 3.0 µm or less. If the thickness of the layered first phase is too small, it is difficult to bring out the properties of the polytetrafluoroethylene, such as the large elongation and large strength due to fibrillization. If the thickness of the layered first phase is too large, it is difficult to reduce the linear expansion coefficient, and as a result of the silica aggregating at a high density, the aggregated portion becomes fragile, thereby deteriorating the elongation of the dielectric sheet. The thickness of the layered first phase falls within the above described range, because such problems are encountered outside the above described range. The thickness of the layered first phase can be adjusted according to the particle diameter of the polytetrafluoroethylene, the particle diameter of the silica, an agitating state of the polytetrafluoroethylene and the silica, and extrusion and molding conditions, and calendering conditions.

Figure 2:
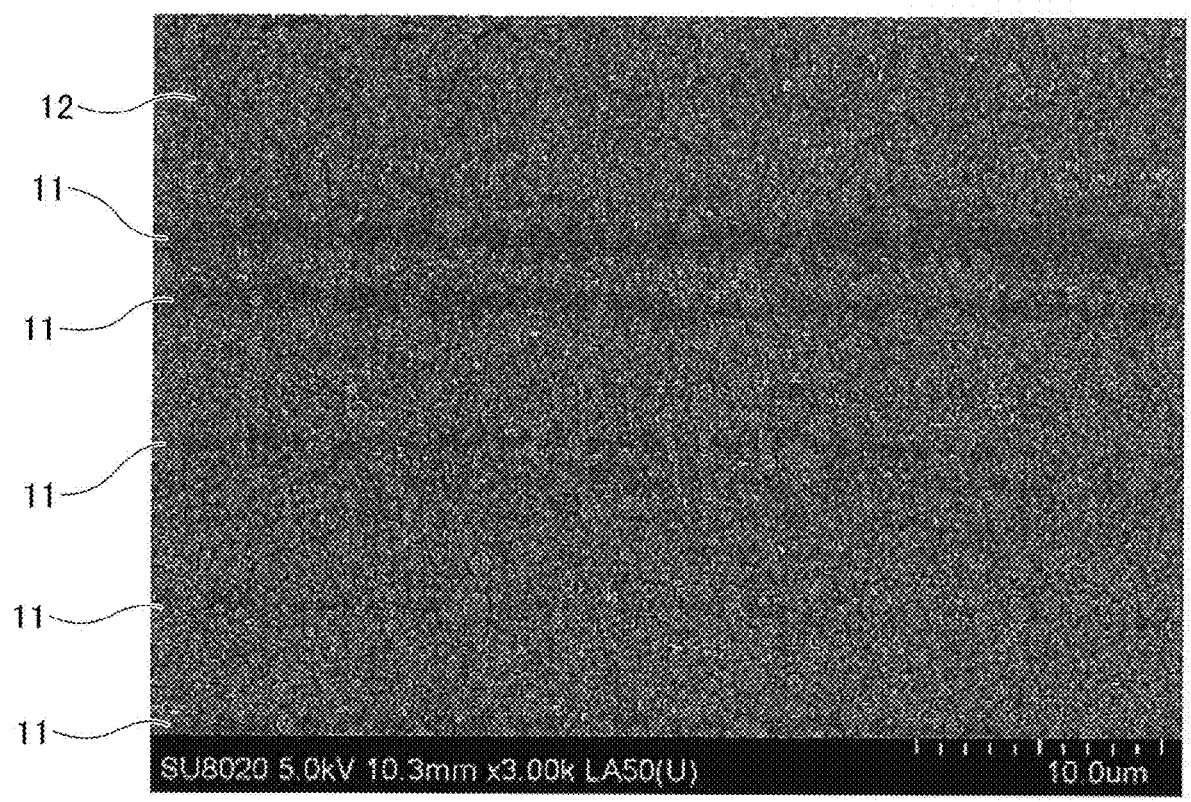
FIG. 2 is a longitudinal cross sectional view in a thickness of the dielectric sheet imaged using a scanning electron microscope.

More particularly, the first phase and the second phase are observed by making a cross sectional sample of the dielectric sheet according to the cross sectional polisher technique, and using a scanning electron microscope to observe a length of 42 µm in the in-plane direction and a length of 30 µm in the thickness direction, at a magnification of 3000 times. FIG. 2 illustrates an image of the longitudinal cross section of the dielectric sheet in the thickness direction imaged using the scanning electron microscope described above. The dielectric sheet illustrated in FIG. 2 was manufactured under conditions in which the average particle diameter of the polytetrafluoroethylene is 500 µm, the average particle diameter of the silica is 0.5 µm, the mass ratio of the silica with respect to the polytetrafluoroethylene is 1.9, the reduction ratio of the extrusion molding is 4.4, and the draft of the calendering step is 0.98. A dark linear layer is a first phase 11 having the polytetrafluoroethylene as the main component. A region having the spherical silica as the main component is a second phase 12.

In the longitudinal cross section in the thickness direction, the disclosed dielectric sheet preferably has a uniform silica distribution. A ratio of a sum total of the cross sectional area of the silica at a distance within 10 µm from a back surface of the dielectric sheet in the longitudinal cross section, with respect to a sum total of the cross sectional area of the silica at a distance within 10 µm from a front surface of the dielectric sheet in the longitudinal cross section, is preferably 1.00 or greater but 1.20 or less, more preferably 1.00 or greater but 1.10 or less, and even more preferably 1.00 or greater but 1.05 or less. This is because, when the ratio of the sum totals of the cross sectional areas of the silica falls outside the above described range, the high frequency characteristics of an electrical circuit provided on the front surface of the dielectric sheet become different from the high frequency characteristics of an electrical circuit provided on the back surface of the dielectric sheet, thereby making it difficult to design the electrical circuit and the electrical component. When measuring the ratio of the sum totals of the cross sectional areas of the silica, it is regarded that the length of a line corresponding to the front surface of the dielectric sheet, and the length of a line corresponding to the back surface of the dielectric sheet, are both 500 μm.

A lower limit of the average thickness of the dielectric sheet 1 is preferably 30 μm, more preferably 50 μm, and even more preferably 100 μm. On the other hand, an upper limit of the average thickness of the dielectric sheet 1 is preferably 1000 μm, more preferably 500 μm, and even more preferably 300 μm. If the average thickness is less than the lower limit described above, the mechanical strength may become insufficient. In addition, it may become difficult to design the circuit and manufacture the circuit components, because an error in the size will have a large effect on the high frequency characteristics of the electrical circuit. On the other hand, if the average thickness exceeds the upper limit described above, the thickness of the substrate for the high-frequency printed wiring board may become too large, and flexibility may become insufficient in a case where the flexibility is required of the dielectric sheet 1. The "average thickness" refers to a distance between an average line of an interface on the side of the front surface, and an average line of an interface on the side of the back surface, within the measured length of the cross section cut along the thickness direction of the object. The "average line" refers to an imaginary line that is drawn along the interface, so that a total area of a mountain (total area above the imaginary line), and a total area of a valley (total area below the imaginary line), defined by the interface and this imaginary line, become the same. An upper limit of a difference between a maximum value and a minimum value of the thickness of the dielectric sheet, for the dielectric sheet that is 1 m$^2$, is preferably ±10 μm or less, more preferably ±5 μm or less, and even more preferably ±2 μm or less. This is because it may become difficult to design the circuit and manufacture the circuit components, if the upper limit of the difference described above falls outside the above described range.

According to the disclosed dielectric sheet, excellent high frequency characteristics and bending resistance can be obtained. The disclosed dielectric sheet is favorable for the base film of the substrate for the high-frequency printed wiring board.

<Substrate for High-Frequency Printed Wiring Board>

Figure 3:
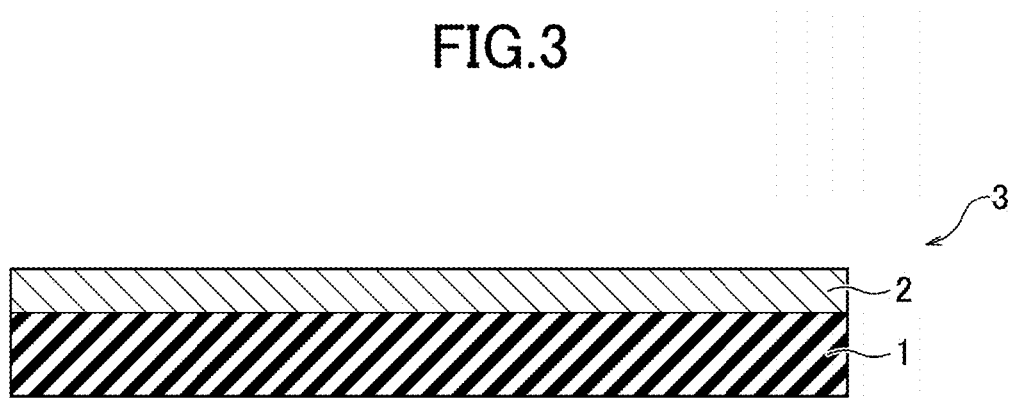
FIG. 3 is a schematic cross sectional view of a substrate for a high-frequency printed wiring board according to one embodiment of the present disclosure.

FIG. 3 is a schematic cross sectional view of the substrate for the high-frequency printed wiring board. As illustrated in FIG. 3, a substrate 3 for the high-frequency printed wiring board includes the dielectric sheet 1, and a copper film 2 laminated directly or indirectly on the surface of the dielectric sheet 1. In other words, the substrate 3 for the high-frequency printed wiring board includes a copper clad laminate (CCL). As described above, because the substrate 3 for the high-frequency printed wiring board includes the dielectric sheet 1, the substrate for the high-frequency printed wiring board has excellent high frequency characteristics and bending resistance.

Details of the configuration of the dielectric sheet are as described above.

[Copper Film]

The copper film 2 etched or the like to form a conductor pattern of the high-frequency printed wiring board.

The copper film 2 is used as a conductive layer, and is patterned into various patterns by etching, for example, when manufacturing the printed wiring board.

The copper film 2 is not particularly limited, as long as the copper film is applicable to the printed wiring board, and may be selected, as appropriate, according to the required characteristics or the like. A lower limit of a purity of copper in the copper film 2 is preferably 99.5 mass %, and more preferably 99.8 mass %. In addition, an upper limit of the purity described above is preferably 99.999 mass %. When the purity described above is greater than or equal to the lower limit, a resistance of the copper film 2 can be reduced, thereby making it possible to further reduce the transmission loss. On the other hand, if the purity described above exceeds the upper limit, it may lead to an increase in cost. The surface of the copper film is preferably treated by a surface treatment generally performed on the copper film for the printed wiring board, such as a treatment aimed at corrosion prevention, and a treatment aimed at improving adhesion. These treatments may be performed by forming a layer made of Zn, Ni, Cr, Si, or the like on the surface of the copper film.

A lower limit of the average thickness of copper film 2 is preferably 5 μm, and more preferably 10 μm. On the other hand, an upper limit of the average thickness described above is preferably 100 μm, and more preferably 75 μm. When the copper film is thick, it is possible to cause a flow of a large current capacity, there is also an advantage in that an excellent thermal conductivity is obtainable. However, if the emphasis is on the demands to increase the layers and to reduce the thickness of the multi-layer high-frequency printed wiring board, the upper limit of the average thickness described above is preferably 20 μm, and more preferably 15 μm.

An upper limit of a maximum height roughness Rz at the surface of the copper film on the side of the dielectric sheet is preferably 2 μm, and more preferably 1 μm. When the maximum height roughness Rz at the surface of the copper film on the side of the dielectric sheet falls within the above described range, irregularities in a portion where the high-frequency signal concentrates due to the skin effect become small, and a current more easily flows linearly, thereby enabling the transmission loss to be further reduced. Accordingly, it is possible to further improve the high frequency characteristics of the disclosed substrate for the high-frequency printed wiring board.

The substrate 3 for the high-frequency printed wiring board may include layers other than the dielectric sheet 1 and the copper film 2.

The copper film 2 of the substrate 3 for the high-frequency printed wiring board may be laminated on at least one of the surfaces of the dielectric sheet 1, via an intermediate layer, such as a known adhesive layer. For example, the adhesive layer is laminated on the dielectric sheet, and the copper film 2 is bonded to this dielectric sheet 1.

Because the disclosed substrate for the high-frequency printed wiring board includes the disclosed dielectric sheet, excellent high frequency characteristics and bending resistance can be obtained. The substrate 3 for the high-frequency printed wiring board may be used as a substrate for a printed wiring board adapted to a subtractive method, for example. When the substrate 3 for the high-frequency printed wiring board is applied to the subtractive method, the copper film 2 is patterned to form copper interconnects or the like, by masking the copper film 2 by a resist pattern or the like and etching the masked copper film. The disclosed substrate for the high-frequency printed wiring board is favorable for use in communication devices using high frequencies, or the like.

Other Embodiments

The embodiments disclosed herein are to be considered illustrative in all respects and not restrictive. The scope of the present disclosure is not limited to the configuration of the embodiments described above, and as presented in the appended claims, includes all variations within the meaning and scope of the claims and equivalents thereof.

The disclosed substrate for the high-frequency printed wiring board may include the copper film laminated on one of the surfaces of the dielectric sheet as in the embodiment described above, or may include the copper film laminated on both surfaces of the dielectric sheet.

The disclosed substrate for the high-frequency printed wiring board does not necessarily need to be used as a substrate for a flexible printed wiring board, and may be used as a substrate for a rigid printed wiring board.

[Exemplary Implementations]

Although the present disclosure will be described in detail below with reference to exemplary implementations, the present disclosure is not limited to these exemplary implementations.

[Dielectric Sheet No. 1 Through No. 16 (Test Examples No. 1 Through No. 16)]

(1) Material Mixing Step

Polytetrafluoroethylene having an average particle diameter of 500 μm, spherical silica having average particle diameters indicated in Table 1, titanium oxide having an average particle diameter of 0.2 μm, and naphtha used as an assistant, were supplied into a container with respective amounts indicated in Table 1. The amount of the naphtha corresponds to 17 mass % of a total of the other materials. The container was rotated at a rate of 5 rpm for 100 minutes at 10° C., to mix the materials. Silica added with a vinyl group at the surface by a silane coupling treatment was used for No. 15, and silica added with a hexyl group at the surface by the silane coupling treatment was used for No. 16. In other cases, no surface treatment was performed. The hydrophobicity of the silica added with the vinyl group on the surface is 0.08, and the hydrophobic property of the silica added with the hexyl group on the surface is 0.10.

(2) Extrusion Molding Step

Next, extrusion molding of the mixture obtained in the material mixing step was performed using a mold. The temperature of the mold for the extrusion molding was 45° C. Because the molding pressure cannot be measured up to high pressure with a common apparatus, the pressure was measured by a capillary rheometer (CAPIROGRAPH 1C manufactured by Toyo Seiki Seisaku-sho Ltd.) which may be regarded as a compact extrusion molding apparatus. The molding pressures are illustrated in Table 1. The extrusion molding temperature was 60° C. The reduction ratio was adjusted by changing the hole diameter of the capillary. The capillary diameter gradually reduced from a thick portion connected to a cylinder, to the hole portion at a tip end, and in the cross sectional view including a symmetry axis of the capillary, an angle formed by two lines corresponding to the inner wall of the capillary is 90 degrees.

(3) Calendering Step

The extrusion molded product having a thickness of 4 mm was sandwiched between two carrier films (polyethylene terephthalate (PET) having a thickness of 125 μm), and passed between two calender rollers having a diameter 9 of 200 mm and a width of 300 mm. Then, the extrusion molded product was calendered to a thickness of 125 μm, to obtain the dielectric sheet. The temperature of the calender rollers was 55° C. The calendering speed was 1 m/min. The calendering direction was in the extrusion direction of the extrusion molded product, and in the width direction perpendicular to the extrusion direction, to adjust the elongation anisotropy coefficient. More particularly, approximately 90 percent of the calendering from 4 mm to 125 μm was made in the width direction. Next, the dielectric sheet was separated from the carrier films, and dried at 100° C. for 2 days. Then, dielectric sheets No. 1 through No. 11 dielectric sheet were pinched by the hot press and heated at 350° C. for 40 minutes, while compressing at a pressure of 4 MPa in the thickness direction.

[Evaluation]

The following evaluations were made on the dielectric sheets No. 1 through No. 11 described above.

(Linear Expansion Coefficient)

The "linear expansion coefficient" is the linear expansion coefficient measured according to the test method of dynamic mechanical properties prescribed in JIS-K7244-4 (1999).

First, the dielectric sheets No. 1 through No. 11 were cut and measured using a TMA (SS7100 manufactured by Hitachi High Tech Science Corporation) under the conditions in which a sample length is 10 mm and a tensile load is 5 gf. After raising the temperature from −30° C. to 200° C. at a rate of 5° C./min, the linear expansion coefficient was computed from the size variation when lowering the temperature from 120° C. to 20° C. at the same rate, and the dielectric sheets were evaluated into three grades. In Table 1, the dielectric sheets are rated as grade C (poor) when the value is 40 ppm/° C. or greater and judged as having a large size variation, rated as grade B (acceptable) when the value is 30 ppm/° C. or greater but less than 40 ppm/° C., and rated as grade A (excellent) when the value is less than ppm/° C.

(Tensile Elongation)

A maximum tensile elongation, a minimum tensile elongation, and an elongation anisotropy coefficient were obtained using an autograph (AGS-X manufactured by Shimadzu Corporation) to perform the measurements at 25° C. in conformance with IPC-TM-650 2.4.19.

(Molding Pressure)

Based on the results of the molding pressure, the extrusion performance was evaluated into the following three grades, such that A is excellent, B is acceptable, and C is poor.

A: Lower than 70 MPa
B: 70 MPa or higher but lower than 90 MPa
C: Molding pressure of 90 MPa or higher When the molding pressure was 90 MPa or higher, the extrusion was not performed using the common extrusion molding apparatus, and further, as a result of the fibrillization in the extrusion molding direction being promoted excessively, it was determined difficult to obtain a dielectric sheet having a small elongation anisotropy coefficient, and thus evaluated as grade C.

(External Appearance of Extrusion)

The external appearance after the extrusion molding was evaluated into the following three grades, such that A is excellent, B and B' are acceptable, and C is poor.

A: Excellent with no external appearance problem
B: Slight trace of waviness at center portion
B': Slightly clogged at end portion
C: Poor external appearance (Hydrophobicity)

Silica was heated under vacuum at 100° C. using Belprep vac-II manufactured by MicrotracBEL Corp., and an adsorption isotherm was measured by the nitrogen gas adsorption method under a liquid nitrogen temperature, to determine a BET specific surface area for nitrogen adsorption by the BET method. Similarly, silica was heated under vacuum at 100° C. using the Belprep vac-II manufactured by MicrotracBEL Corp., and the adsorption isotherm was measured at 25° C., to determine the BET specific surface area for water vapor adsorption using the BET method. The hydrophobicity was computed by dividing the value of the BET specific surface area for the water vapor adsorption by the value of the BET specific surface area for the nitrogen adsorption. The smaller this value becomes, the more hydrophobic the material becomes.

Table 1 illustrates the evaluation results of dielectric sheets No. 1 through No. 16, and "-" indicates that a corresponding component is not included.

TABLE 1

| | Test Example No. | | 1 | 2 | 3 | 4 | 5 | 6 | 7 | 8 | 9 |
|---|---|---|---|---|---|---|---|---|---|---|---|
| Material | PTFE mass (parts by mass) | | 100 | 100 | 100 | 100 | 100 | 100 | 100 | 100 | 100 |
| | Silica particle diameter first type | Silica average particle diameter [μm] | — | 0.5 | 0.5 | 0.5 | 0.5 | 0.5 | 0.5 | 0.5 | 5.0 |
| | | Silica mass (parts by mass) | — | 92 | 138 | 175 | 175 | 175 | 175 | 175 | 175 |
| | Silica particle diameter second type | First silica average particle diameter [μm] | — | — | — | — | — | — | — | — | — |
| | | First Silica mass (parts by mass) | — | — | — | — | — | — | — | — | — |
| | | Second silica average particle diameter [μm] | — | — | — | — | — | — | — | — | — |
| | | Second silica mass (parts by mass) | — | — | — | — | — | — | — | — | — |
| | Mass ratio of first silica with respect to PTFE | | — | — | — | — | — | — | — | — | — |
| | Mass ratio of all silica with respect to PTFE | | 0.000 | 0.920 | 1.380 | 1.750 | 1.750 | 1.750 | 1.750 | 1.750 | 1.750 |
| | Titanium oxide mass (parts by mass) | | — | 8 | 12 | 15 | 15 | 15 | 15 | 15 | 15 |
| | Assistant mass (parts by mass) | | 17 | 34 | 43 | 49 | 49 | 49 | 49 | 49 | 49 |
| Evaluation | Linear expansion coefficient [ppm/° C.] | | 169 / C | 47 / C | 34 / B | 22 / A | 22 / A | 22 / A | 22 / A | 22 / A | 22 / A |
| | Reduction ratio | | 3.5 | 3.5 | 3.5 | 10.0 | 7.0 | 5.5 | 4.4 | 3.5 | 3.5 |
| | Molding pressure [MPa] | | 5 / A | 36 / A | 48 / A | 92 / C | 71 / B | 65 / A | 59 / A | 55 / A | 91 / C |
| | Minimum tensile elongation [%] | | — | — | 104 | — | — | — | — | 44 | — |
| | Elongation anisotropy coefficient | | — | — | 1.2 | — | — | — | — | 1.4 | — |
| | Cylinder diameter | | 30 | 30 | 30 | — | 50 | 50 | 50 | 30 | — |
| | Short side (extrusion thickness) [mm] | | 4 | 4 | 4 | — | 3 | 4 | 5 | 4 | — |
| | Long side (extrusion width) [mm] | | 50 | 50 | 50 | — | 90 | 90 | 90 | 50 | — |
| | Long side/short side ratio | | 12.5 | 12.5 | 12.5 | — | 28.9 | 22.5 | 18.0 | 12.5 | — |
| | Extrusion appearance | | A | A | A | — | B' | B | A | A | — |
| | Surface treatment | | — | — | — | — | — | — | — | — | — |
| | Hydrophobicity | | — | — | — | — | — | — | — | — | — |

| | Test Example No. | | 10 | 11 | 12 | 13 | 14 | 15 | 16 |
|---|---|---|---|---|---|---|---|---|---|
| Material | PTFE mass (parts by mass) | | 100 | 100 | 100 | 100 | 100 | 100 | 100 |
| | Silica particle diameter first type | Silica average particle diameter [μm] | 6.0 | 6.0 | — | — | — | 0.5 | 0.5 |
| | | Silica mass (parts by mass) | 175 | 140 | — | — | — | 175 | 175 |
| | Silica particle diameter second type | First silica average particle diameter [μm] | — | — | 0.3 | 0.3 | 0.2 | — | — |
| | | First Silica mass (parts by mass) | — | — | 35 | 52.5 | 35 | — | — |
| | | Second silica average particle diameter [μm] | — | — | 6 | 6 | 6 | — | — |
| | | Second silica mass (parts by mass) | — | — | 140 | 123 | 140 | — | — |

TABLE 1-continued

| | | | | | | | | |
|---|---|---|---|---|---|---|---|---|
| | Mass ratio of first silica with respect to PTFE | — | — | 0.35 | 0.53 | 0.35 | — | — |
| | Mass ratio of all silica with respect to PTFE | 1.750 | 1.400 | 1.750 | 1.755 | 1.750 | 1.750 | 1.750 |
| | Titanium oxide mass (parts by mass) | 15 | 15 | 15 | 15 | 15 | 15 | 15 |
| | Assistant mass (parts by mass) | 49 | 43 | 49 | 49 | 49 | 49 | 49 |
| Evaluation | Linear expansion coefficient [ppm/° C.] | 22 | 37 | 22 | 22 | 22 | 22 | 22 |
| | | A | B | A | A | A | A | A |
| | Reduction ratio | 3.5 | 3.5 | 3.5 | 3.5 | 3.5 | 3.5 | 3.5 |
| | Molding pressure [MPa] | >100 | >100 | 89 | 69 | 83 | 55 | 50 |
| | | C | C | B | A | B | A | A |
| | Minimum tensile elongation [%] | — | — | 165 | — | — | 78 | 206 |
| | Elongation anisotropy coefficient | — | — | 1.3 | — | — | 1.1 | 1.0 |
| | Cylinder diameter | — | — | 30 | 30 | 30 | 30 | 30 |
| | Short side (extrusion thickness) [mm] | — | — | 4 | 4 | 4 | 4 | 4 |
| | Long side (extrusion width) [mm] | — | — | 50 | 50 | 50 | 50 | 50 |
| | Long side/short side ratio | — | — | 12.5 | 12.5 | 12.5 | 12.5 | 12.5 |
| | Extrusion appearance | — | — | B' | — | — | A | A |
| | Surface treatment | — | — | — | — | — | Vinyl group | Hexyl group |
| | Hydrophobicity | — | — | — | — | — | 0.08 | 0.10 |

From the results in Table 1, excellent results were obtained with regard to the linear expansion coefficient and the molding pressure, for the test examples No. 3, No. 5 through No. 8, No. 15, and No. 16 in which the mass ratio of the silica with respect to the polytetrafluoroethylene is 1.3 or greater, the average particle diameter of the silica is 0.1 μm or greater but 3.0 μm or less, and the reduction ratio is 8 or less, and for the test examples No. 12 through No. 14 in which the mass ratio of the silica with respect to the polytetrafluoroethylene is 1.3 or greater, the silica includes the first silica having the average particle diameter of 0.1 μm or greater but 0.9 μm or less, and the second silica having the average particle diameter of 4 μm or greater but 9 μm or less, the mass ratio of the first silica with respect to the polytetrafluoroethylene is 0.2 or greater but 1.9 or less, and the reduction ratio is 8 or less.

On the other hand, the test example No. 1 including no silica, and the test example No. 2 in which the mass ratio of the silica with respect to the polytetrafluoroethylene is less than 1.3, exhibited a large linear expansion coefficient. Further, the molding pressures became high for the test example No. 4 in which the reduction ratio exceeds 8, and the test examples No. 9, No. 10, and No. 11 in which the silica has an average particle diameter exceeding 3 μm.

In addition, when the test example No. 15 in which the vinyl group is added as a surface treatment, the test example No. 16 in which the hexyl group is added as the surface treatment, and the test example No. 8 in which no surface treatment is made, were compared, the test example No. 16 in which the hexyl group is added had a minimum tensile elongation which is greatly improved over the test example No. 15 in which the vinyl group having the higher hydrophobicity is added. From this result, it can be seen that an excellent effect of improving the bending resistance is obtainable by adding the alkyl group having the carbon number 4 or greater at the silica surface, to increase the adhesion between the silica and the polytetrafluoroethylene, rather than increasing the hydrophobicity of the silica surface.

The results described above demonstrated that the disclosed method for manufacturing the dielectric sheet can positively manufacture dielectric sheet having excellent high frequency characteristics, by extrusion molding at a low pressure.

DESCRIPTION OF REFERENCE NUMERALS

1 Dielectric sheet
2 Copper film
3 Substrate for high-frequency printed wiring board
11 First phase
12 Second phase

The invention claimed is:

1. A dielectric sheet comprising:
spherical silica, and polytetrafluoroethylene, wherein:
a mass ratio of the spherical silica with respect to the polytetrafluoroethylene is 1.3 or greater,
a ratio of a maximum tensile elongation with respect to a minimum tensile elongation is 1.5 or less, and the minimum tensile elongation is 40% or greater, and
the spherical silica includes a first silica having an average particle diameter of 0.1 μm or greater but 0.9 μm or less, and a second silica having an average particle diameter of 4.0 μm or greater but 9.0 μm or less.

2. The dielectric sheet as claimed in claim 1, wherein, in a longitudinal cross section in a thickness direction, the dielectric sheet has a layered first phase including the polytetrafluoroethylene as a main component, and a layered second phase including the spherical silica as a main component.

3. The dielectric sheet as claimed in claim 2, wherein the first phase has a thickness of 0.1 μm or greater but 10.0 μm or less.

4. The dielectric sheet as claimed in claim 1, wherein the spherical silica includes an alkyl group having a carbon number of 4 or greater on a surface of the spherical silica.

5. The dielectric sheet as claimed in claim 4, wherein the spherical silica does not include a functional group other than the alkyl group on the surface of the spherical silica.

6. A substrate for a high-frequency printed wiring board, comprising:
the dielectric sheet according to claim 1; and
a copper film laminated directly or indirectly on the surface of the dielectric sheet.

7. The substrate for the high-frequency printed wiring board as claimed in claim 6, wherein a maximum height roughness Rz of the copper film at a surface of the copper film on the side of the dielectric sheet is less than or equal to 2 μm.

8. The substrate for the high-frequency printed wiring board as claimed in claim 6, wherein the copper film is laminated on the surface of the dielectric sheet via an adhesive layer including a fluororesin as a main component.

9. A dielectric sheet comprising:
- a mixture of spherical silica and polytetrafluoroethylene formed by an extrusion molding, wherein:
- a mass ratio of the spherical silica with respect to the polytetrafluoroethylene is 1.3 or greater,
- a ratio of a maximum tensile elongation with respect to a minimum tensile elongation is 1.5 or less, and the minimum tensile elongation is 40% or greater,
- a reduction ratio of the extrusion molding of the mixture is 2 or greater but 8 or less, and
- the spherical silica includes a first silica having an average particle diameter of 0.1 μm or greater but 0.9 μm or less, and a second silica having an average particle diameter of 4.0 μm or greater but 9.0 μm or less.

\* \* \* \* \*